United States Patent
Lin et al.

(10) Patent No.: US 8,054,097 B2
(45) Date of Patent: Nov. 8, 2011

(54) METHOD AND SYSTEM FOR AUTOMATICALLY MANAGING PROBE MARK SHIFTS

(75) Inventors: Sam Lin, Tainan (TW); Lin Chun Hung, Hsin-Chu (TW); Tsung Hsien Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 846 days.

(21) Appl. No.: 11/682,781

(22) Filed: Mar. 6, 2007

(65) Prior Publication Data
US 2008/0218189 A1    Sep. 11, 2008

(51) Int. Cl.
*G01R 31/02* (2006.01)
*G01R 31/26* (2006.01)
*G01R 31/20* (2006.01)

(52) U.S. Cl. ............ 324/762.03; 324/754.1; 324/762.05

(58) Field of Classification Search ........................ None
See application file for complete search history.

(56) References Cited

U.S. PATENT DOCUMENTS

| | | | |
|---|---|---|---|
| 5,644,245 A * | 7/1997 | Saitoh et al. .................. | 324/754 |
| 2004/0227504 A1* | 11/2004 | Strom ......................... | 324/158.1 |
| 2005/0075835 A1 | 4/2005 | Tseng et al. | |
| 2007/0164763 A1* | 7/2007 | Park ............................ | 324/758 |

OTHER PUBLICATIONS

Chinese Patent Office, Office Action issued Sep. 20, 2010, Application No. 200710106561.X, 6 pages.

* cited by examiner

*Primary Examiner* — Roberto Velez
(74) *Attorney, Agent, or Firm* — Haynes and Boone, LLP (57) ABSTRACT

Disclosed is a method and a system for automatically managing probe mark shifts. A determination is made from test data as to whether a die on a wafer is defective. A probe mark check on the wafer is made to determine whether a probe mark is shifted. Necessary recovery action is performed in response to the probe mark being shifted. In the probe mark check, a plurality of probe mark positions are selected from the test data. A determination is then made as to whether at least one of the plurality of probe mark positions violates an engineering rule.

19 Claims, 14 Drawing Sheets

60 — 1 point +/- 1 sigma
62 — Probe Mark Area +/- 1 sigma
64 — 2 of 3 point +/- 2 sigma
66 — 4 of 5 point +/- 1 sigma
68 — Continue 2 point ascending or descending.
70 — Probe mark area/Pad size*100% = 20% (Customer and Engineer define)

METHOD AND SYSTEM FOR AUTOMATICALLY MANAGING PROBE MARK SHIFTS

BACKGROUND

The present disclosure relates in general to integrated circuit manufacturing technology, and more particularly, to probe mark shifts in the integrated circuit manufacturing technology. The present disclosure also relates to a method and system for automatically managing probe mark shifts.

In integrated circuit manufacturing technology, testing is a final step for detecting defects generated during the integrated circuit fabrication process and determining the root causes of these defects. Prior to the packaging process, circuit probe testing is performed among the wafers to verify that each die meets product specifications. To ensure that circuit probes are correctly aligned, probe mark inspections may be performed to determine whether probe mark shifts occur. Probe mark shifts involve shifting of a probe mark on a pad, which indicates that the probe mark had exceeded the pad's safe scope. Currently, probe mark inspections are performed by operators, who inspect the wafers using a microscope. Another way probe mark shifts may be detected is based on customer complaints. When a complaint occurs, engineers analyze the log history of the probing tool and determine when a probe shift occurs and to what extent the dies are impacted.

With probe mark inspections being performed by operators, human errors may be introduced in the process, which affects test quality. In addition, test cycle time and yield is impacted. Detection of probe mark shifts based on the customer complaints also affects the overall service quality of the manufacturer and the need for operators and engineers increase the cost of production. As a result, the time to market, scrap ratio, and product quality are impacted. Therefore, a need exists for a method and system that automatically manage probe mark shifts and take corrective action, such that customer service quality may be improved.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Aspects of the present disclosure provide a method and a system for automatically managing probe mark shifts to improve customer service quality. In an illustrative embodiment, test data is collected from a prober and a probe mark check is performed to identify a probe mark shift if a die is defective. A recovery action is then performed to correct the probe mark shift if necessary. Alternatively, the engineer is notified and prober is stopped. The recovery action includes performing real-time probe mark optimization based on probe mark positions determined from a multidirectional seek. The multidirectional seek includes a horizontal seek and a vertical seek. The real-time probe mark optimization includes performing an offset optimization algorithm to determine an offset angle and a direction of rotation in order to compensate for the probe mark shift. In this way, real time adjustments can be made to minimize future probe mark shifts.

Figure 1:
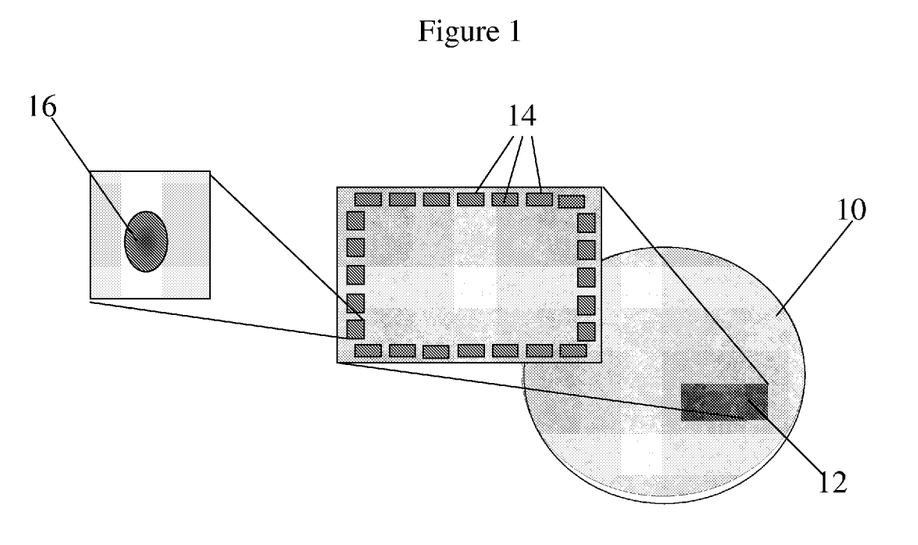
FIG. 1 is a diagram of an exemplary probe mark.

Referring to FIG. 1, a diagram illustrating an exemplary probe mark is depicted. A wafer 10 may include a plurality of dies 12. Each die 12 may include a plurality of pads 14. When wafer 10 is tested, a prober positions wafer 10 for contact with probe card interface probe needles. A probe mark 16 is a mark of a probe needle on the pad 14. Good alignment of probe mark 16 on the pad 14 is essential in wafer testing.

Figure 2:
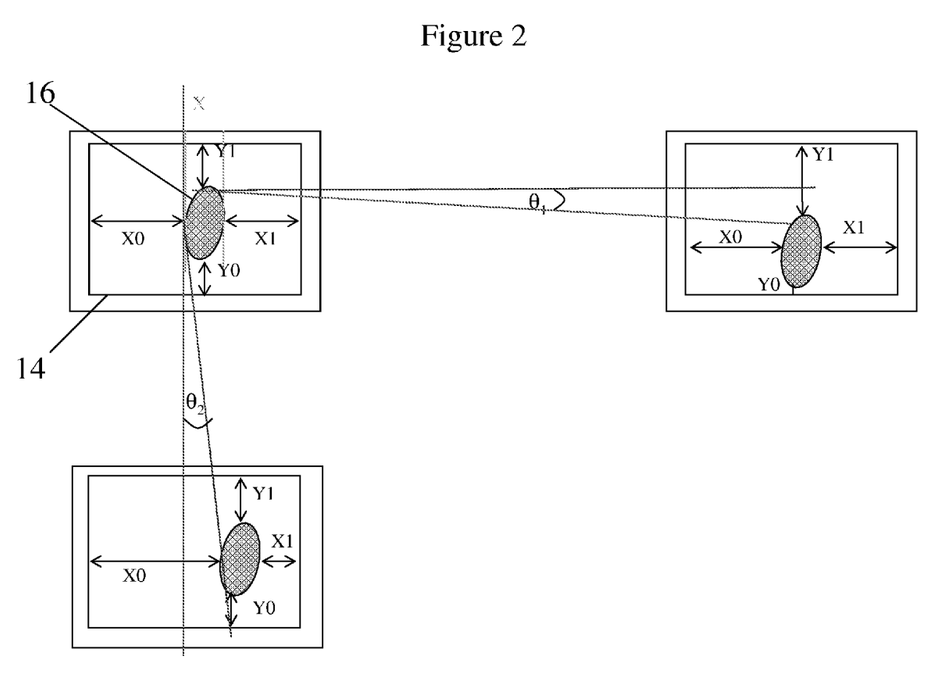
FIG. 2 is a diagram of exemplary probe mark shifts.

Referring to FIG. 2, a diagram of exemplary probe mark shifts is depicted. A probe mark shift occurs when the probe mark 16 exceeds the safe scope of pad 14. In a first example, probe mark 16 is shifted by angle $\theta_1$. In a second example, probe mark 16 is shifted by angle $\theta_2$. $\theta_1$ and $\theta_2$ are referred to as offset angles. $\theta_1$ and $\theta_2$ may be determined from dimensions X0, X1, Y0, and Y1. More details regarding dimensions X0, X1, Y0, and Y1 are discussed with reference to FIG. 7 below.

Figure 3:
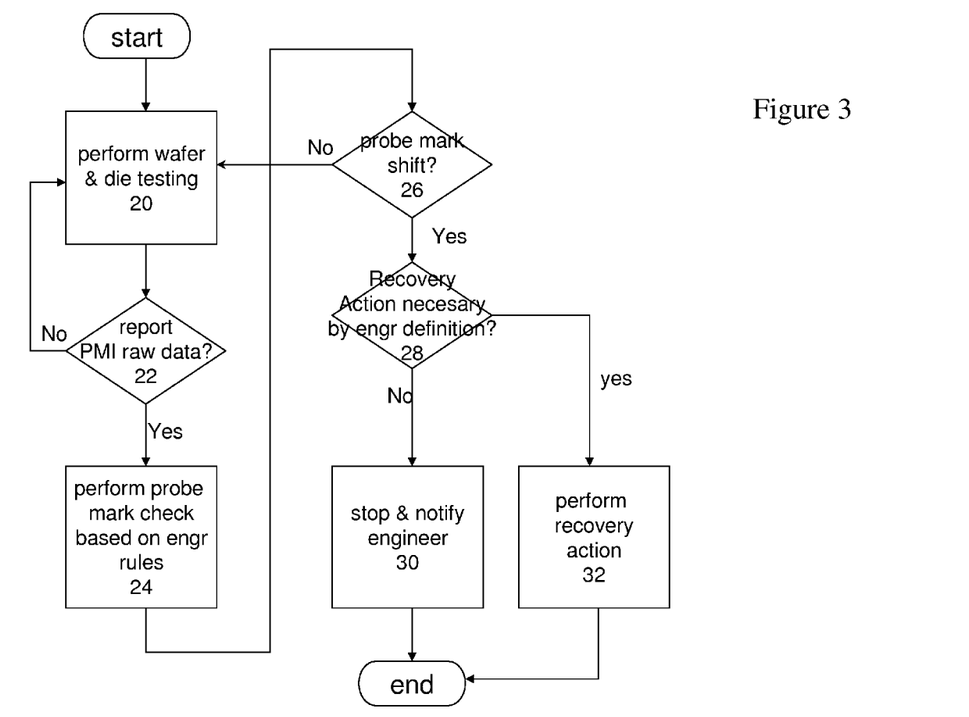
FIG. 3 is a flowchart of an exemplary process for automatically managing probe mark shifts.

Referring to FIG. 3, a flowchart of an exemplary process for automatically managing probe mark shifts provided by aspects of the present disclosure is depicted. The process begins at step 20 when performing wafer and die testing of wafer 10 on a prober. At step 22, a determination is made as to whether the die is defective based on the probe mark inspection (PMI) raw data. If the die is not defective, the process returns to step 20 to perform further testing. If the die is defective, a probe mark check is performed for the die at step 24 based on engineering rules. More details regarding probe mark check performed are discussed below with reference to FIG. 4.

Based on the probe mark check, a determination is made as to whether a probe mark shift occurs at step 26. If no probe mark shift occurs, the process returns to step 20 to perform further testing. If probe mark shift occurs, a determination is made at step 28 as to whether recovery action is necessary based on definition specified by the engineers. If a recovery action is necessary, recovery action at step 32 is performed to correct probe mark shifts. More details regarding recovery action performed are discussed below with reference to FIG. 5. However, if a recovery action is not necessary, the prober is stopped at step 30 and sending a notice to an engineer or an operator to handle the probe mark shift. The process then terminates.

Figure 4:
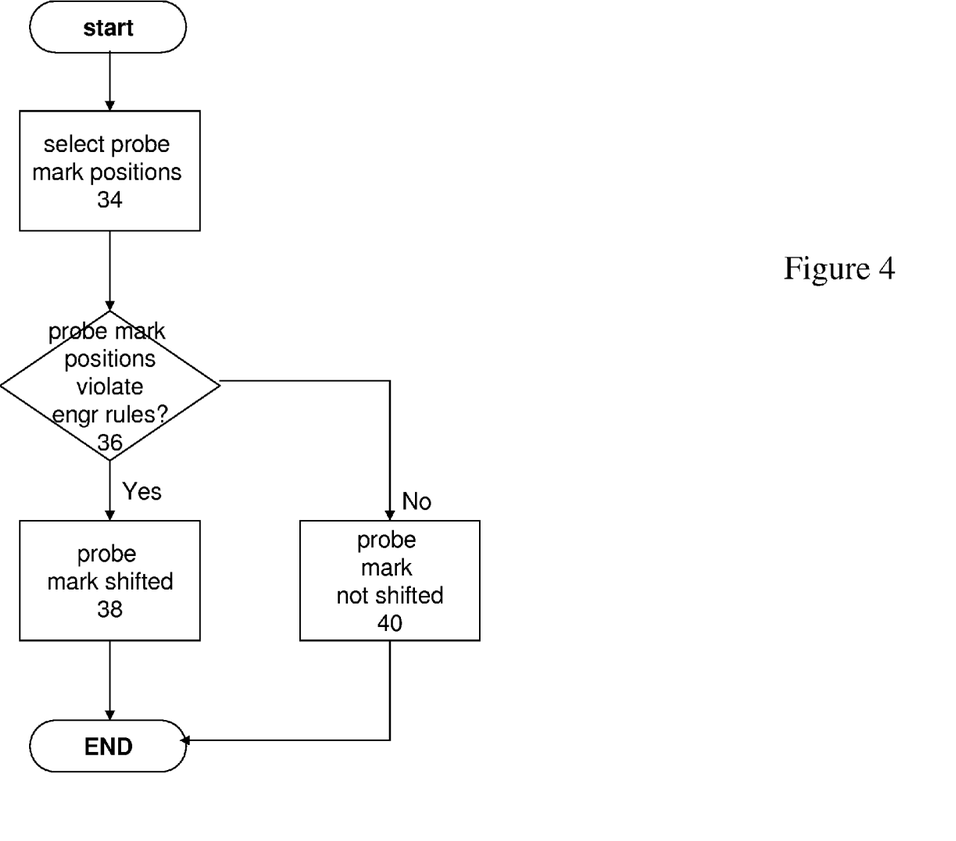
FIG. 4 is a flowchart of an exemplary process for performing probe mark check based on engineering rules.

Referring to FIG. 4, a flowchart of an exemplary process for performing probe mark check based on engineering rules is depicted. The process begins at step 34 when a plurality of probe mark positions are selected from the wafer. More details regarding selection of probe mark positions are discussed below with reference to FIGS. 8-10. Next, a determination is made as to whether probe mark positions violate engineering rules. More details regarding the engineering rules are discussed below with reference to FIG. 11. If probe mark positions violate engineering rules, the probe mark is identified as shifted at step 38. If probe mark positions do not violate engineering rules, the probe mark is identified as not shifted at step 40.

Figure 5:
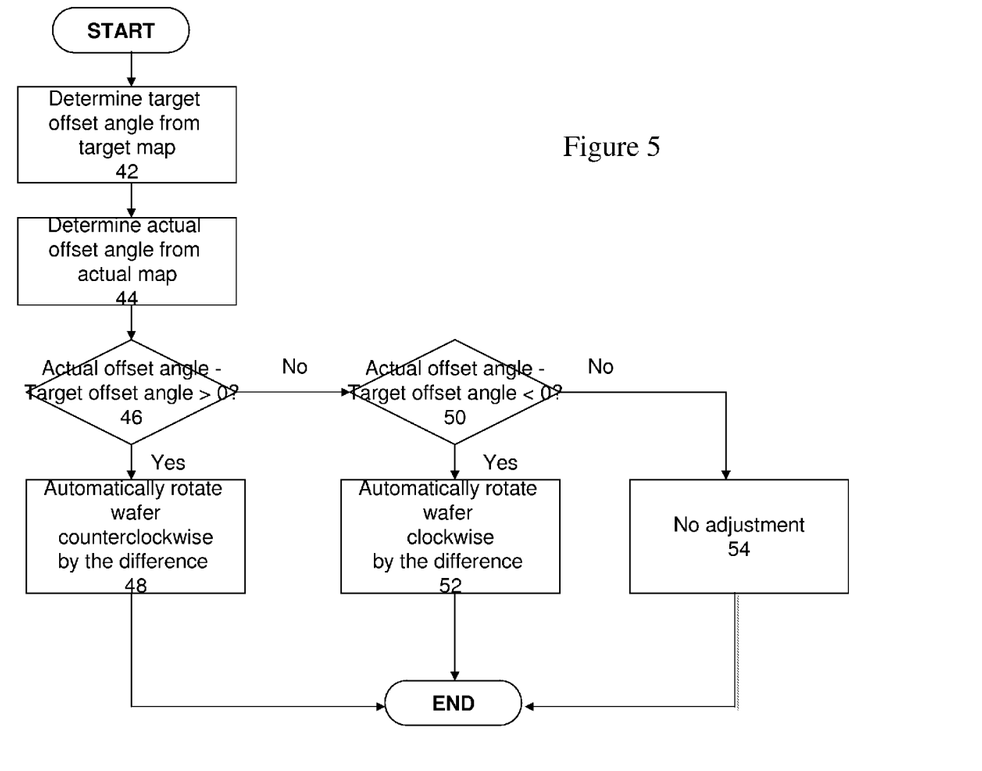
FIG. 5 is a flowchart of an exemplary process for the offset optimization algorithm.

If a probe mark is identified as shifted, necessary recovery action may be performed to correct the probe mark shift. One recovery action is to perform an offset optimization algorithm. Referring to FIG. 5, a flowchart of an exemplary process for the offset optimization algorithm is depicted. The process begins at step 42 where a target offset angle θ is determined from the target offset map. In an illustrative embodiment, the target offset angle θ may be determined by using formula $\tan^{-1}(Y1/X1)$, where Y1 and X1 are determined from the target offset map. At step 44, an actual offset angle θ is determined from the actual offset map. In an illustrative embodiment, the actual offset angle θ may be determined by using formula $\tan^{-1}(Y1'/X1')$, where Y1' and X1' are determined from the actual offset map. More details regarding the target offset map and the actual offset map are discussed below with reference to FIG. 12.

A determination is then made at step 46 as to whether a difference between the actual offset angle θ and the target offset angle θ is greater than zero. A difference greater than zero means that a probe mark has been shifted clockwise and adjustment is needed. The difference itself indicates the offset angle θ for compensating the probe mark shifts. If the difference between the actual offset angle θ and the target offset angle θ is greater than zero, the wafer stage which holds the wafer is automatically rotated in the counterclockwise direction by the difference at step 48. However, if the difference between the actual offset angle θ and the target offset angle θ is not greater than zero, a determination is made at step 50 as to whether the difference between the actual offset angle θ and the target offset angle θ is less than zero. A difference less than zero also means that a probe mark has been shifted counterclockwise and adjustment is needed. The difference itself indicates the offset angle θ for compensating the probe mark shifts.

If the difference between the actual offset angle θ and the target offset angle θ is less than zero, the wafer stage is automatically rotated clockwise by the difference at step 52. However, if the difference between the actual offset angle θ and the target offset angle θ is not less than zero at step 50, no adjustment is made at step 54 because no difference between target and actual offset angles means that no probe mark shift occurs. Thus, the process terminates.

Figure 6:
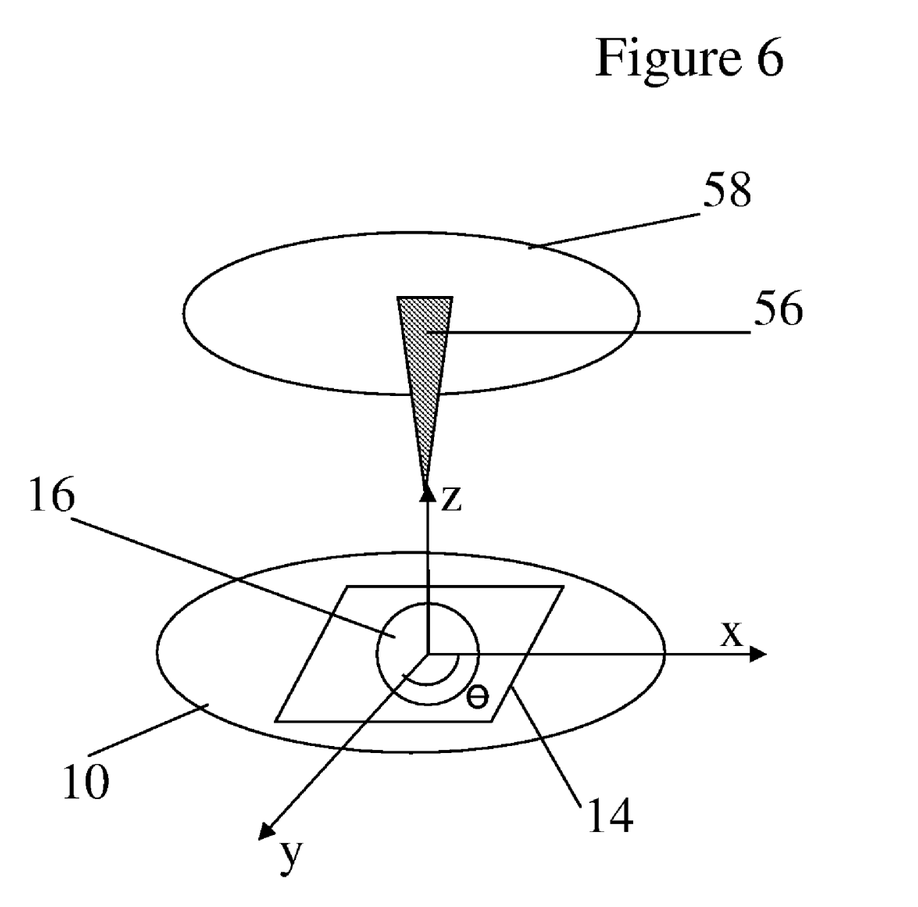
FIG. 6 is a diagram illustrating parameters used in determining probe mark positions.

Referring to FIG. 6, a diagram illustrating parameters used in determining probe mark positions is depicted. When a probe needle 56 of a probe card interface 58 contacts the wafer 10, the probe needle 56 makes a probe mark 16 on the pad 14 of wafer 10. The positions of the probe mark 16 may be determined from several parameters: x-y position, Z-stage and offset angle θ. The x-y position describes position of probe needle 56 in two orthogonal directions in relation to pad 14 on the wafer plane. Z stage positions wafer 10 in the z-direction to make contact with probe needle 56. If the Z stage positions wafer 10 too high, there is a risk of damaging the wafer 10 and the probe needle 56. If the Z-stage positions wafer 10 too low, there may be insufficient or no contact between the probe needle 56 and wafer 10. Therefore, Z stage control is essential. Offset angle θ is the angle of rotation adjusted such that the probe needle 56 is centered on the pad 14 of the wafer 10. Typically, a probe mark shift may be caused by shifting of probe needle 56 or wafer 10.

As discussed above in FIG. 4, selection of probe mark positions is necessary to determine whether probe mark positions violate engineering rules. One aspect of the present disclosure selects probe mark positions by selecting at least four absolute positions or opposite positions of probe marks as input parameters. The positions are selected from actual raw data collected from the prober.

Figure 7:
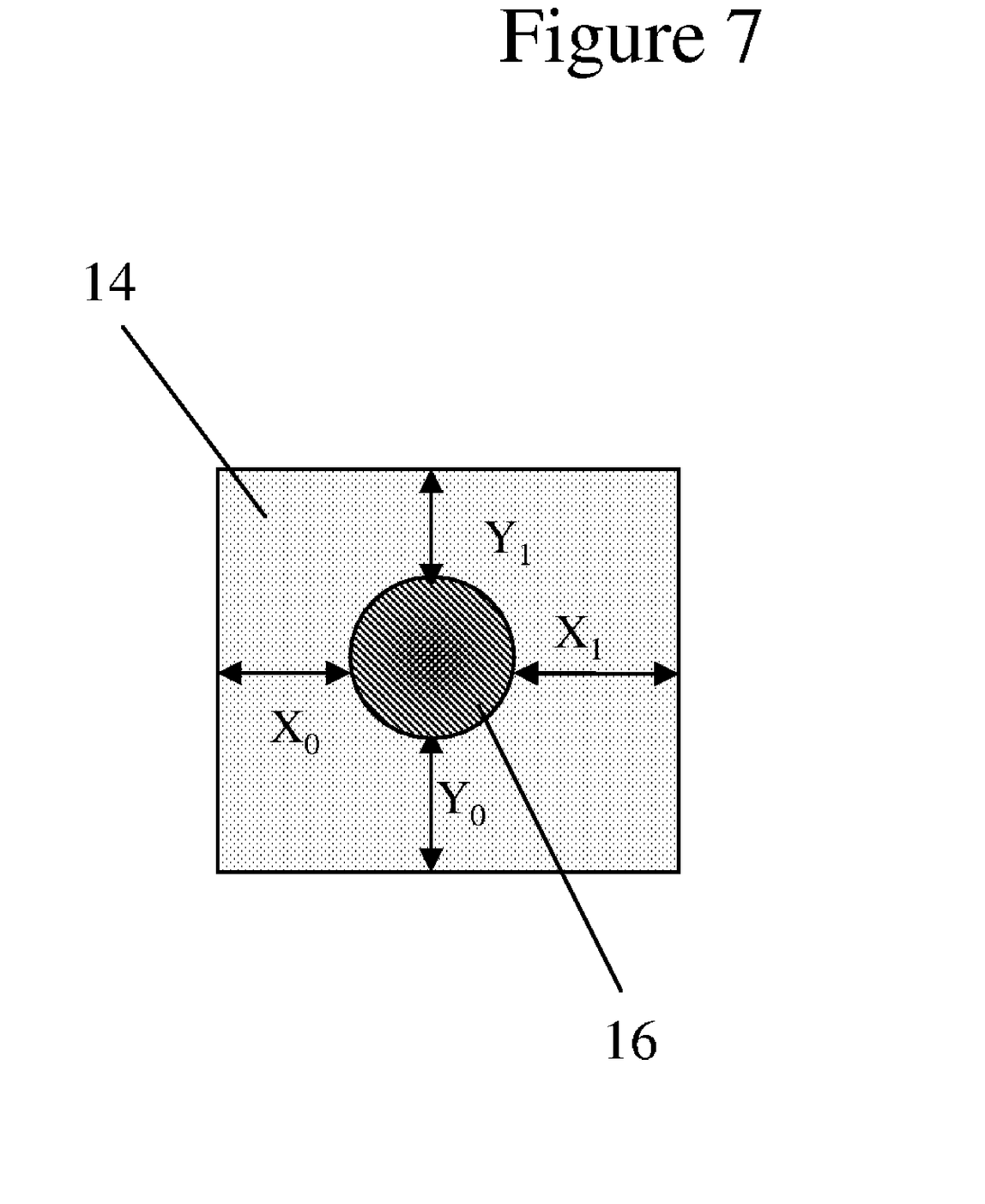
FIG. 7 is a diagram of exemplary absolute positions of probe marks.

Referring to FIG. 7, a diagram of exemplary absolute positions of probe marks is depicted. Each of the absolute positions include X0, X1, Y0, Y1, and Z (not shown). X0 is a distance between the left boundary of pad 14 and left boundary of probe mark 16 in x-direction. X1 is a distance between the right boundary of pad 14 and the right boundary of probe mark 16 in x-direction. Y1 is a distance between upper boundary of pad 14 and the upper boundary of probe mark 16 in y-direction. Y0 is a distance between the lower boundary of pad 14 and the lower boundary of probe mark 16 in y-direction. Z is the distance between the probe needle 56 and the probe mark 16 as discussed in FIG. 6. Using absolute positions of four pads of four dies on the same wafer, probe mark shifts caused by to the probe needle 56 or shift of wafer 10 may be detected and avoided.

Figure 8:
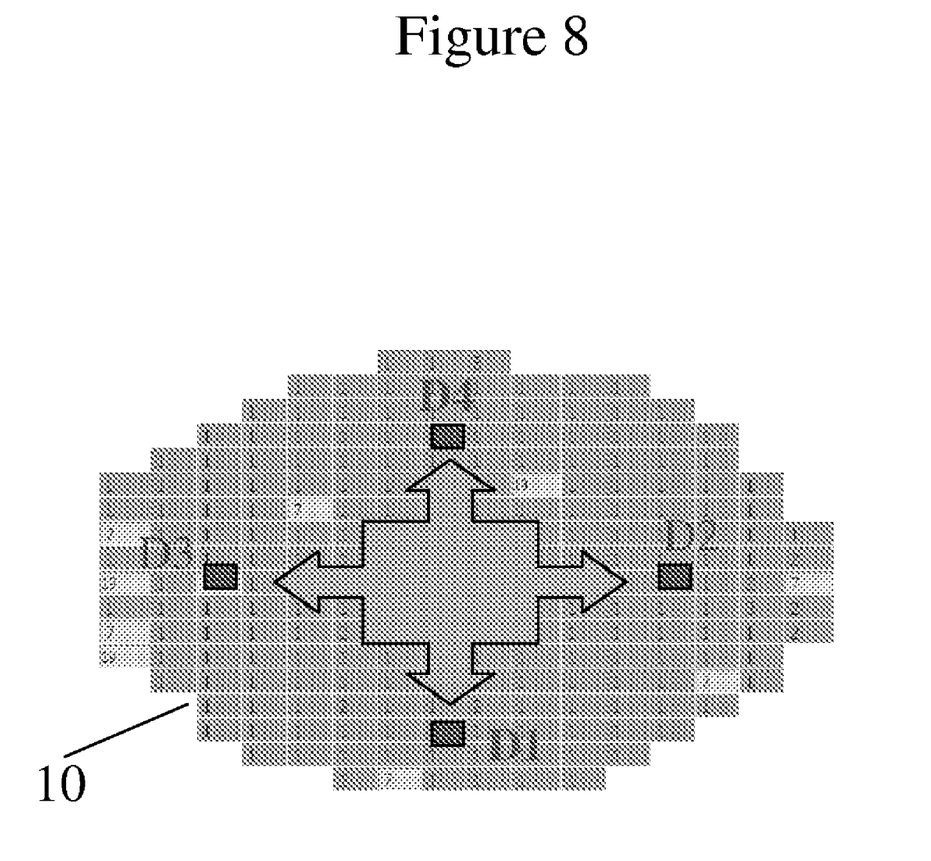
FIG. 8 is a diagram illustrating exemplary opposite positions of probe marks.

Referring to FIG. 8, a diagram illustrating exemplary opposite positions of probe marks is depicted. In order to monitor a wafer with 500 to 600 dies, the minimum number of dies selected for testing probe mark quality is four. However, more dies may be selected for testing probe mark quality without departing the spirit and scope of the present disclosure. In this example, four absolute positions are selected from four dies of a wafer: D1, D2, D3, and D4. The fours dies may be selected randomly as long as the distance between the dies are far apart from each other on the wafer. For example, the four dies may be located at the four corners of the wafer.

As shown in FIG. 8, four opposite positions are selected from two pairs of dies of wafer 10. Each pair comprises a plurality of dies that are located opposite to each other in either x- or y-direction. For example, D1 is opposite to D4 in y-direction, while D2 is opposite to D3 in x-direction. Each of the opposite positions include X0, X1, Y0 and Y1 for one pad in each of the four dies. A difference of probe mark positions between the opposite dies is determined which indicates whether a probe mark is shifted. For example, a difference of probe mark positions between D1 and D4 indicates a shift in y-direction and a difference of probe mark positions between D2 and D3 indicates a shift in the x-direction. The difference in positions may be used to control die position shifts for wafer 10 and avoid shifting of pads 14 when a die shift occurs. For example, if D1 has a Y0 value of 3 and D4 has a Y0 value of 2. This means that probe mark had shifted in y-direction because the Y0 values are no longer the same between D1 and D4. A change in value of Y0 or Y1 indicates a probe mark shift in y-direction.

In addition to selecting four absolute positions and opposite positions, another aspect of the present disclosure select probe mark positions based on a multidirectional seek. In an illustrative embodiment, multidirectional seek includes a horizontal seek and a vertical seek.

Figure 9:
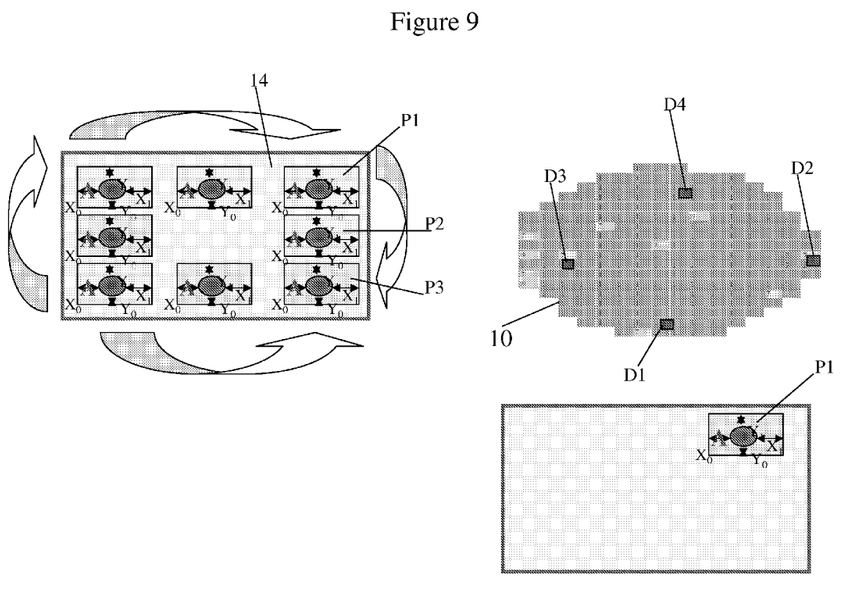
FIG. 9 is a diagram illustrating a horizontal seek.

Referring to FIG. 9, a diagram illustrating a horizontal seek is depicted. In horizontal seek, probe mark positions of different pads may be selected within the same die. For example, probe mark positions of P1, P2, and P3 may be selected within the same die 14. Alternatively, probe mark positions of the same pad may be selected among different dies of the wafer. For example, probe mark positions of the same pad P1 may be selected from D2, D3, and D4 of wafer 10.

Figure 10:
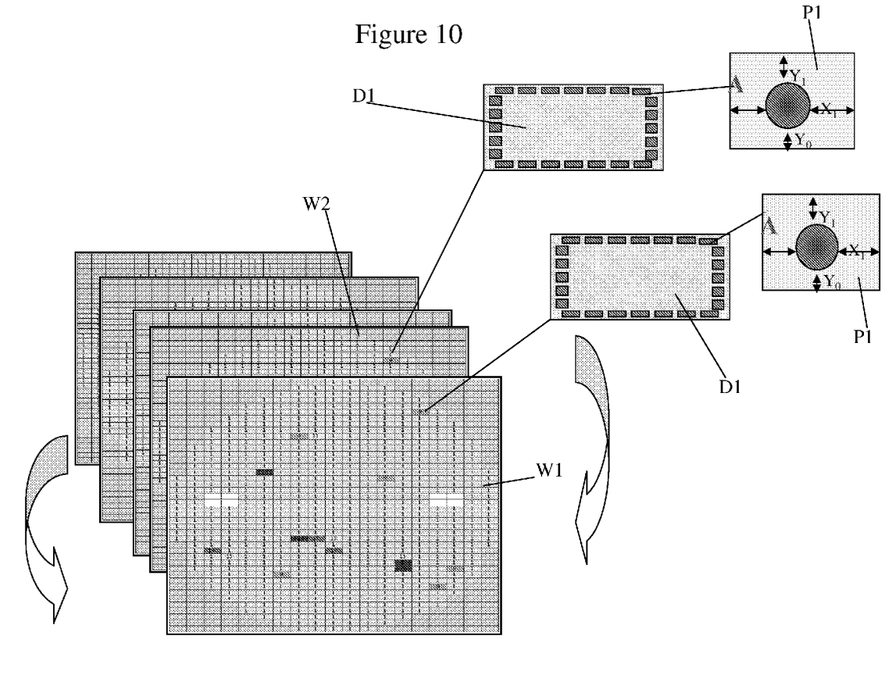
FIG. 10 is a diagram illustrating a vertical seek.

In vertical seek, probe mark positions of the same pad of the same die may be selected among different wafers. Referring to FIG. 10, a diagram illustrating a vertical seek is depicted. In this example, probe mark positions of P1 of D1 of W1 and probe mark positions of P1 of D1 of W2 may be selected. Once probe mark positions are selected using these methods, a check against engineering rules may be performed to determine if a probe mark has shifted.

Figure 11:
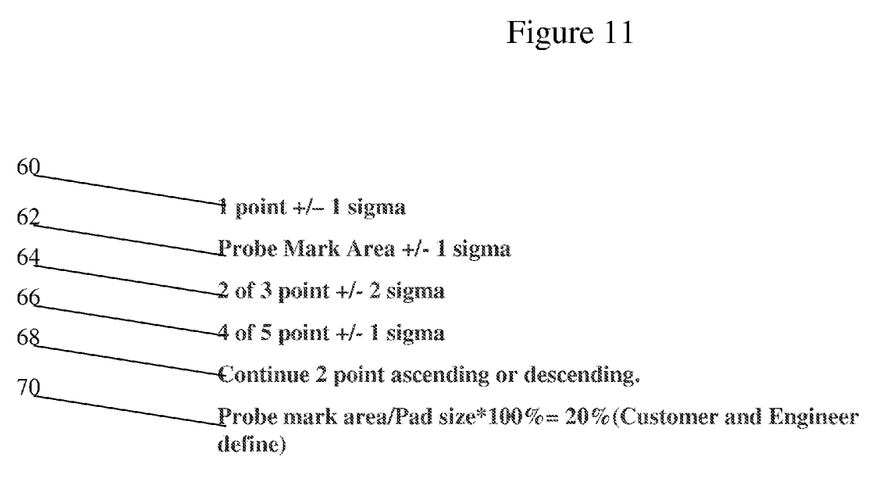
FIG. 11 is a diagram illustrating exemplary engineering rules defined by engineers for probe mark check.

Referring to FIG. 11, a diagram illustrating exemplary engineering rules defined by engineers for probe mark check is depicted. Engineers may define a number of rules for determining if a probe mark has shifted. For example, rule 60 requires that one of the probe mark positions of a pad has to be within +/−1 sigma tolerance. Rule 62 requires that the probe mark area of the pad has to be within +/−1 sigma tolerance. Rule 64 requires that two out of three probe mark positions of the pads have to be within +/−2 sigma tolerance. Rule 66 requires four out of five probe mark positions of the pad have to be within +/−1 sigma tolerance. Rule 68 requires selecting two ascending or descending probe marks. Rule 70 request that the probe mark area in relation to the pad size to be within 20 percent, which represents a percentage defined by the customer. The rules of this example are defined for illustrative purposes. Other engineering rules may also be defined to determine probe mark shifts without depart the spirit and scope of the present disclosure. For example, one or more of these rules in combination may be selected by the engineers.

Figure 12:
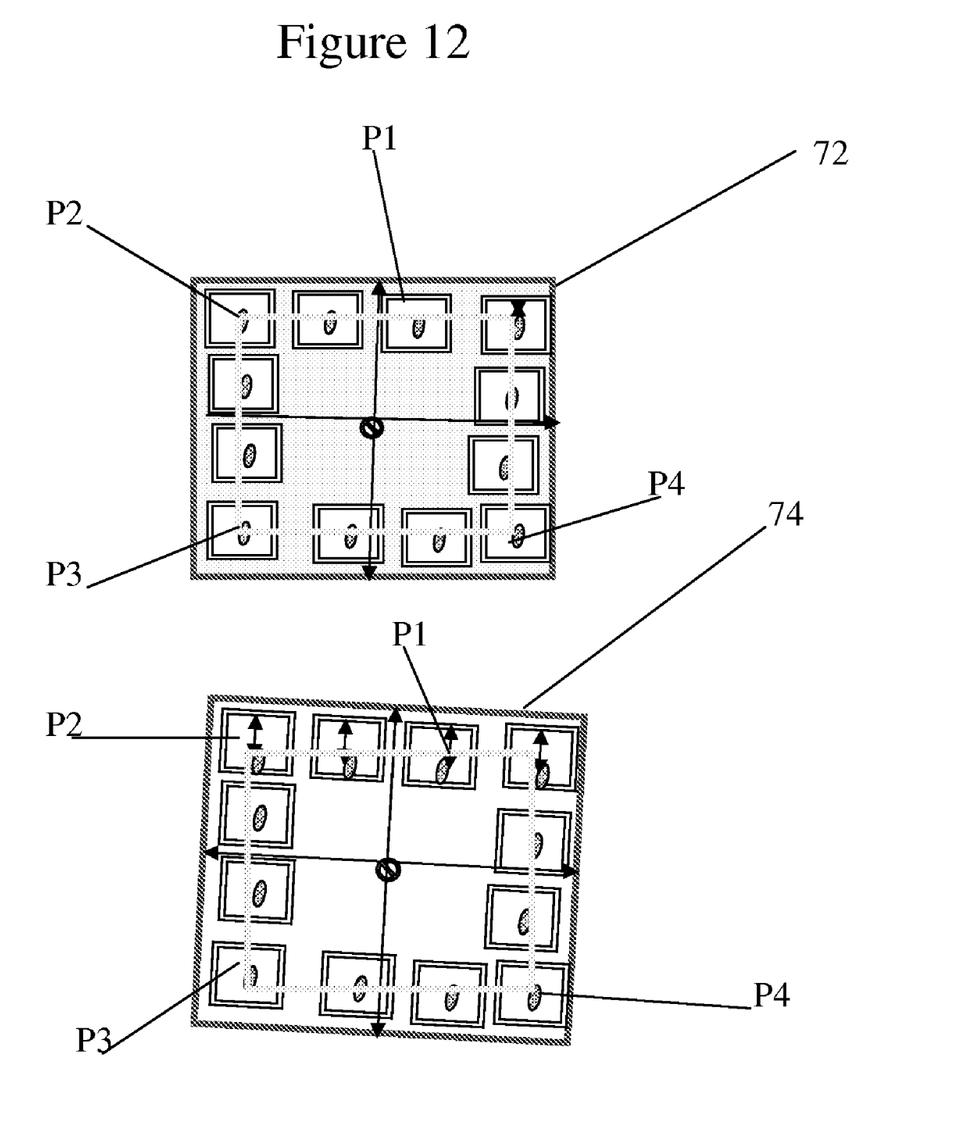
FIG. 12 is a diagram illustrating a target offset map and an actual offset map.

As discussed above in FIG. 3, a recovery action may be performed if a tested die is defective to correct the probe mark shift. The recovery action performed may comprise a real-time probe mark optimization. In a real-time probe mark optimization, a target offset map and an actual offset map are generated to determine an offset angle. Referring to FIG. 12, a diagram illustrating a target offset map and an actual offset map is depicted. A target offset map 72 is generated when a new part is set up or when a probe card interface is set. In this example, target offset map 72 is generated from target probe mark positions of four selected pads P1, P2, P3 and P4. The four pads are selected randomly on the die. Each of the target probe mark positions includes X0, X1, Y0, Y1, and the probe mark area. From target offset map 72, a target offset angle $\theta$ may be determined based on the target probe mark positions on the pads.

The actual map 74 is generated from actual raw data collected from the prober. In this example, an actual offset map 74 is generated from actual probe mark positions of four selected pads P1, P2, P3 and P4. The four pads may be selected randomly on the die. Each of the actual probe mark positions includes X0', X1', Y0', Y1', and the probe mark area'. From actual offset map 74, an actual offset angle $\theta$ may be determined based on the actual probe mark positions on the pads. Once target offset map 72 and actual offset map 74 are generated, an offset optimization algorithm is performed as discussed in FIG. 5 above to determine the offset angle and a direction of rotation for compensating the probe mark shifts.

Figure 13:
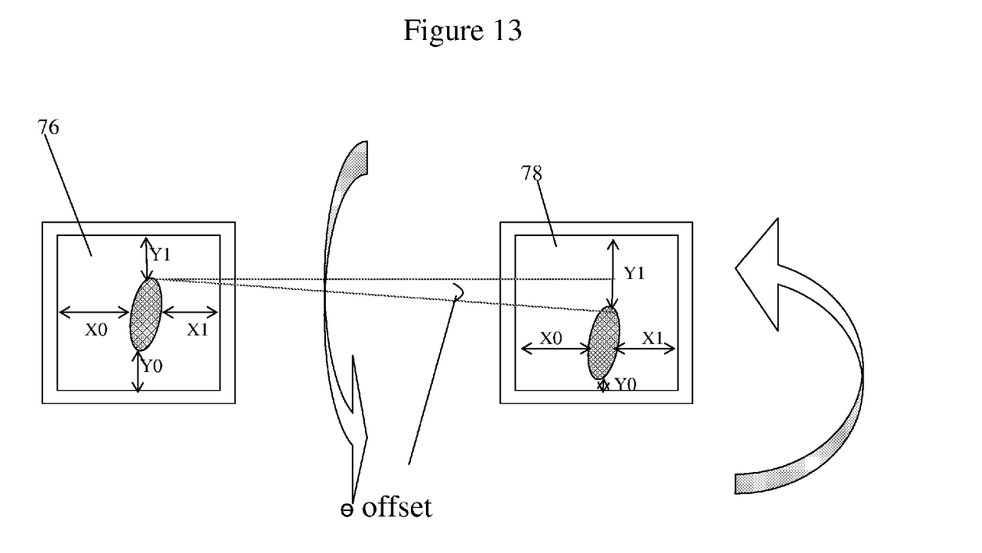
FIG. 13 is a diagram of an exemplary implementation of the offset optimization algorithm in FIG. 5.

Referring to FIG. 13, a diagram of an exemplary implementation of the offset optimization algorithm in FIG. 5 is depicted. In this example, the difference between target offset angle $\theta$ determined from target offset map 72 and the actual offset angle $\theta$ determined from the actual offset map 74 is greater than zero. In other words, a probe mark shift has been shifted clockwise and adjustment is required to compensate for the shift. Thus, the wafer stage which holds the wafer is automatically rotated counterclockwise by the difference to compensate for the probe mark shift.

Figure 14:
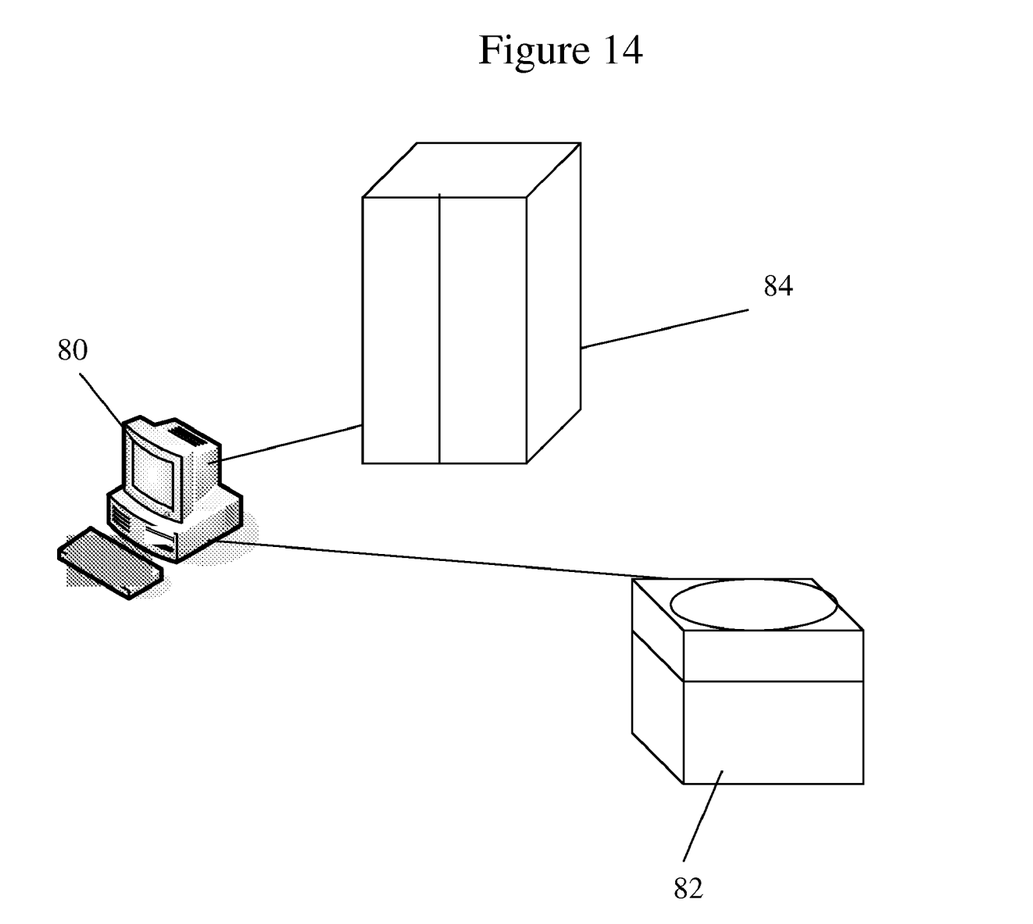
FIG. 14 is a diagram illustrating a system for automatically managing probe mark shifts.

Referring to FIG. 14, a diagram illustrating a system for automatically managing probe mark shifts is depicted. Aspects of the present disclosure may be implemented within a data processing system 80. Data processing system 80 collects actual raw data of probe marks from prober 82 and transmit data to storage 84. Prober 82 comprises a probe card interface 58 as shown in FIG. 6 and other components for securing the wafer 10 for probe testing. Prober 82 is used to perform individual die tests and recovery action if adjustment is necessary. Aspects of the present disclosure, including selection of probe mark positions, multidirectional seek, and the offset optimization algorithm, may be implemented as software executing within data processing system 80 as defined by the engineers.

In one embodiment, data processing system 80 may comprise a determination module that is operable to determine from test data whether a die on a wafer is defective. In addition, the data processing system 80 may comprise a checking module operable to perform a probe mark check on the wafer to determine whether a probe mark is shifted in response to a determination that the die is defective. The checking module may select a plurality of dies from the wafer and select a plurality of probe mark positions from the plurality of dies. The checking module may also select a plurality of dies from the wafer, wherein the plurality of dies are located opposite to each other on the wafer in either x- or y-direction and select a plurality of probe mark positions from the plurality of dies.

Furthermore, the prober 82 may comprise a recovery module operable to perform necessary recovery action in response to the probe mark being shifted. The recovery module may determine a target offset angle from the target offset map, an actual offset angle from the actual offset map, and a difference between the target offset angle and the actual offset angle to form an offset angle. The recovery module may automatically rotate the wafer stage holding the wafer in a counterclockwise direction by the offset angle if the difference between the target offset angle and the actual offset angle is greater than zero, and automatically rotate the wafer stage holding the wafer in a clockwise direction by the offset angle if the difference between the target offset angle and the actual offset angle is less than zero.

In an alternative embodiment, the data processing system is configured to collect test data from the prober, transmit the test data to the storage, and instruct the prober to perform recovery action if necessary.

In summary, aspects of the present disclosure provide automatic management of probe mark shifts. Real time statistics may be gathered on a die-by-die basis based on actual raw data collected from the prober. If a die is defective based on the raw data, a sampling check is performed against engineering rules to determine if a probe mark shift has occurred. If so, necessary recovery action may be performed or the engineer may be immediately notified. Using four absolute and opposite positions of probe marks, offset angle θ may be determined at real time using an offset optimization algorithm and adjustments may be made to compensate for any probe mark shift. In this way, real time statistics may be used to calibrate the circuit probes to minimize future probe mark shifts. Furthermore, by automatically managing probe mark shifts, customer service quality may be improved due to improvement of test quality and test yield.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method of automatically managing probe mark shifts, the method comprising:
   determining from test data whether a die on a wafer is defective;
   performing, in response to a determination that the die is defective, a probe mark check on the wafer to determine whether a probe mark is shifted in a direction parallel to a top surface of the die;
   wherein performing a probe mark check on the wafer includes:
      selecting a plurality of probe mark positions from the test data; and
      determining if at least one of the plurality of probe mark positions violates an engineering rule; and
   automatically performing necessary recovery action in response to the probe mark being shifted, including performing a real-time offset optimization using the plurality of probe mark positions;
   wherein performing a real-time offset optimization using the plurality of probe mark positions includes:
      generating a target offset map from a target plurality of probe mark positions; and
      generating an actual offset map from the plurality of probe mark positions.

2. The method of claim 1, wherein selecting a plurality of probe mark positions comprises:
   selecting a plurality of dies from the wafer; and
   selecting a plurality of probe mark positions from the plurality of dies.

3. The method of claim 1, wherein each of the plurality of probe mark positions comprises:
   a distance between a left boundary of a pad of a die in the plurality of dies and a left boundary of a probe mark in x-direction;
   a distance between a right boundary of the pad of the die in the plurality of dies and a right boundary of the probe mark in x-direction;
   a distance between an upper boundary of the pad of the die in the plurality of dies and an upper boundary of the probe mark in y-direction; and
   a distance between a lower boundary of the pad of the die in the plurality of dies and a lower boundary of the probe mark in y-direction.

4. The method of claim 3, wherein each of the plurality of probe mark positions further comprises:
   a Z stage, wherein the Z stage positions the wafer in z-direction to make contact with the probe; and
   an area of the probe mark.

5. The method of claim 1, wherein selecting a plurality of probe mark positions comprises:
   selecting a plurality of dies from the wafer, wherein the plurality of dies are located opposite to each other on the wafer in either x- or y- direction; and
   selecting a plurality of probe mark positions from the plurality of dies.

6. The method of claim 1, wherein selecting a plurality of probe mark positions comprises:
   selecting a plurality of probe mark positions from a plurality of different pads within a die of the wafer.

7. The method of claim 1, wherein selecting a plurality of probe mark positions comprises:
   selecting a plurality of probe mark positions of a same pad among different dies of the wafer.

8. The method of claim 1, wherein selecting a plurality of probe mark positions comprises:
   selecting a plurality of probe mark positions of a same pad of a same die among different wafers.

9. The method of claim 1, further comprises:
   notifying an engineer in response to the probe mark being shifted.

10. The method of claim 1, wherein performing an offset optimization using the plurality of probe mark positions further comprises:
    determining a target offset angle from the target offset map;
    determining an actual offset angle from the actual offset map; and
    determining a difference between the target offset angle and the actual offset angle to form an offset angle.

11. The method of claim 10, wherein performing an offset optimization using the plurality of probe mark positions further comprises:
    automatically adjusting a wafer stage holding the wafer in a counterclockwise direction by the offset angle if the difference between the target offset angle and the actual offset angle is greater than zero.

12. The method of claim 10, wherein performing an offset optimization using the plurality of probe mark positions further comprises:
    automatically adjusting a wafer stage holding the wafer in a clockwise direction by the offset angle if the difference between the target offset angle and the actual offset angle is less than zero.

13. A system for automatically managing probe mark shifts comprising:
    a prober that collects test data from a wafer;
    a determination module operable to determine from the test data collected by the prober whether a die on the wafer is defective;
    a checking module operable to perform, in response to a determination that the die is defective, a probe mark check using the test data collected by the prober to determine whether a probe mark is shifted in a direction parallel to a top surface of the die;

wherein the checking module is operable to select a plurality of dies from the wafer and select a plurality of probe mark positions from the plurality of dies;

a recovery module in communication with the prober, the recovery module being operable to automatically determine, in response to the probe mark being shifted, a target offset angle from a target offset map based on a target plurality of probe mark positions, an actual offset angle from an actual offset map based on the plurality of probe mark positions, and a differential offset angle that is a difference between the target offset angle and the actual offset angle.

14. The system of claim 13, wherein the checking module is operable to select a plurality of dies from the wafer, wherein the plurality of dies are located opposite to each other on the wafer in either x- or y- direction and select a plurality of probe mark positions from the plurality of dies.

15. The system of claim 13, wherein the recovery module is operable to automatically rotate a wafer stage holding the wafer in a counterclockwise direction by the differential offset angle if the differential offset angle is greater than zero, and automatically rotate the wafer stage holding the wafer in a clockwise direction by the differential offset angle if the differential offset angle is less than zero.

16. A system for automatically managing probe mark shifts comprising:

a data processing system;

a storage; and a prober configured to perform testing of a wafer and collect test data, wherein the test data includes a plurality of probe mark positions, each probe mark position in the plurality of probe mark positions being an absolute position of a probe mark within a respective pad;

wherein the data processing system is configured to collect the test data from the prober, transmit the test data to the storage, compare the probe mark positions to each other to determine if a difference between the probe mark positions violates rule information, and instruct the prober to perform recovery action if the difference between the probe mark positions violates the rule information.

17. The system of claim 16, wherein the difference between the probe mark positions includes a difference in x-y position of probe marks within their respective pads.

18. The system of claim 16, wherein the difference between the probe mark positions includes an offset angle between the probe marks within their respective pads.

19. The system of claim 18, wherein the recovery action includes rotation of the wafer based on the offset angle.

* * * * *